(12) United States Patent
Yabe (10) Patent No.: US 6,456,166 B2
(45) Date of Patent: Sep. 24, 2002

(54) SEMICONDUCTOR INTEGRATED CIRCUIT AND PHASE LOCKED LOOP CIRCUIT

(75) Inventor: Tomoaki Yabe, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/836,508

(22) Filed: Apr. 18, 2001

(30) Foreign Application Priority Data

May 18, 2000 (JP) ......................................... 2000-146423

(51) Int. Cl.[7] .............................. H03R 5/24; H03L 7/099
(52) U.S. Cl. ............................... 331/34; 331/8; 331/17; 331/57; 331/175; 331/177 R; 331/186; 327/156; 327/543
(58) Field of Search ............................ 331/8, 17, 34, 331/57, 175, 177 R, 185, 186; 327/156–159, 538, 543

(56) References Cited

U.S. PATENT DOCUMENTS 5,635,879 A * 6/1997 Sutardja ....................... 331/57

FOREIGN PATENT DOCUMENTS

JP 10-098356 4/1998

* cited by examiner

Primary Examiner—David Mis
(74) Attorney, Agent, or Firm—Banner & Witcoff, Ltd.

(57) ABSTRACT

Object of the present invention is to provide a semiconductor integrated circuit and a voltage control oscillator capable of performing stable oscillating operation and generating an oscillating signal with little jitter. The present invention has a VCO cell, a replica cell constituted in the same way as the VCO cell, an operational amplifier, and a current generator bias circuit. A NMOS transistor is connected between a node in the VCO cell and a ground terminal. The operational amplifier controls the voltages of a node in the replica cell and the node in the VCO so that they are equal to the reference voltage. Because of this, the PMOS transistor composing of a current generator always operates at pentode region, thereby stabilizing the oscillating operation. Furthermore, according to the present embodiment, a CC jitter at low frequency side can be reduced more efficiently than that of the conventional circuit.

15 Claims, 7 Drawing Sheets

SEMICONDUCTOR INTEGRATED CIRCUIT AND PHASE LOCKED LOOP CIRCUIT

CROSS REFERENCE TO RELATED APPLICATIONS

The subject application is related to subject matter disclosed in Japanese Patent Application No. 146423/2000 filed on May 18, 2000 in Japan to which the subject application claims priority under Paris Convention and which is incorporated herein by reference.

BACKGROUND OF THE INVENTION

1. Field of the Invention

The present invention relates to a semiconductor integrated circuit and a phase locked loop circuit used to a voltage control oscillator and so on.

2. Related Background Art

A phase locked loop (PLL) circuit is used to various applications, because it is possible to easily realize IC implementation and generate an oscillating signal with a high degree of accuracy. The PLL circuit is provided with a VCO (Voltage Control Oscillator). The VCO performs control to change frequency of oscillating signal, based on a control voltage signal in accordance with phase difference between a reference signal and a feedback signal. More specifically, the frequency of the oscillating signal is controlled so that phases of the reference signal coincides with that of the feedback signal.

Figure 1:
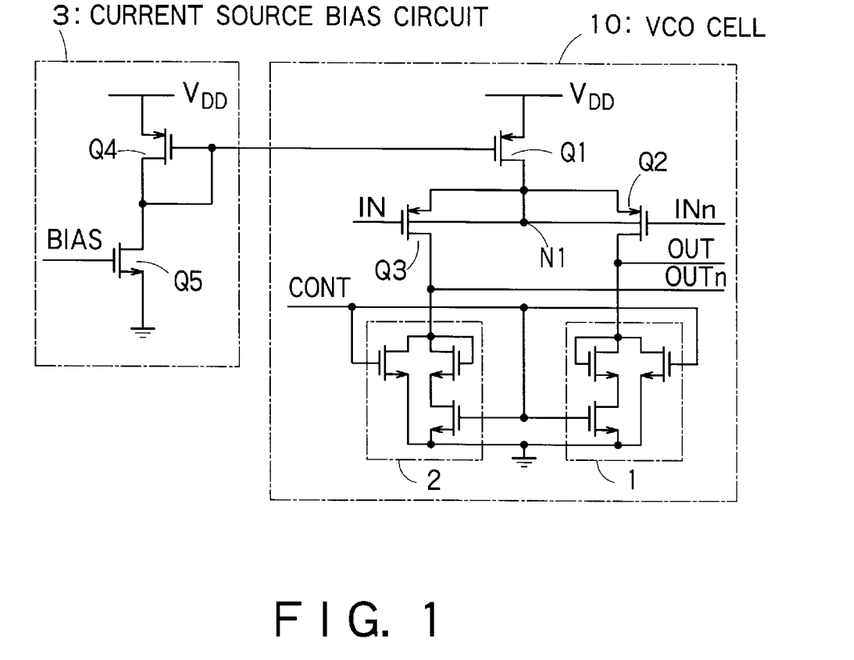
FIG. 1 is a circuit of a conventional VCO.

FIG. 1 is a circuit of a conventional VCO. The VCO of FIG. 1 has a current generator composed of a PMOS transistor (first transistor) connected between a power supply terminal VDD and a node N1, a PMOS transistor (second transistor) Q2 connected between the node N1 and an output terminal OUT, a PMOS transistor (third transistor) Q3 connected between the node N1 and the other terminal OUTn, a variable impedance load (first variable impedance load) 1 connected between the output terminal OUT and a ground terminal, a variable impedance load (second variable impedance load) 2 connected between the output terminal OUTn and the ground terminal, and a current generator 3 for supplying a bias voltage to a gate terminal of the PMOS transistor Q1.

The current generator bias circuit 3 includes a PMOS transistor Q4 for functioning as a diode, and a NMOS transistor Q5. A BIAS signal applied to a gate terminal of the NMOS Q5 can control the current passing through a source and a drain of the PMOS transistor Q4. The impedances of the variable impedance load 1 and 2 are controlled by a CONT signal.

Figure 2:
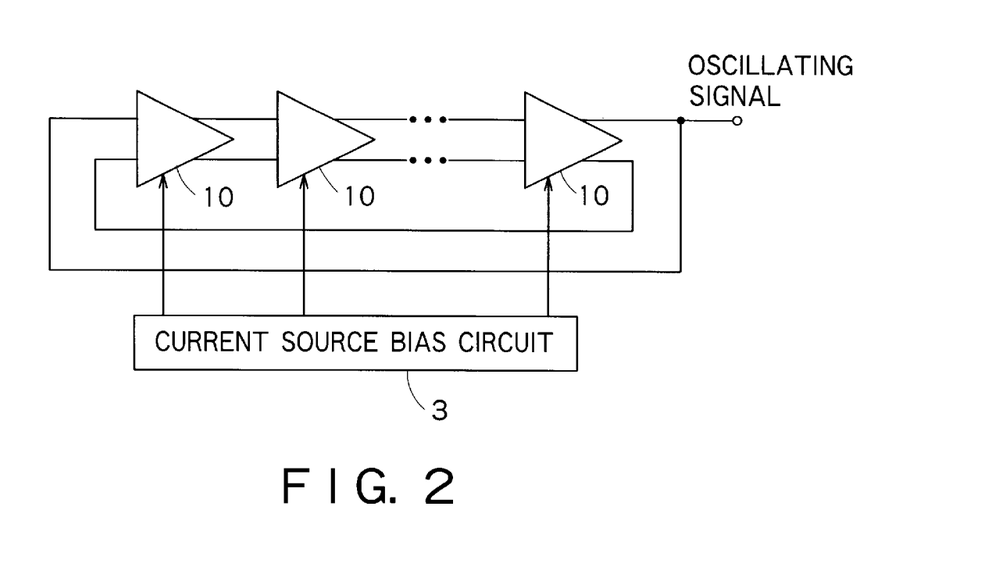
FIG. 2 is a block diagram showing a configuration of a conventional VCO.

Practically, the VCO has a plurality of VCO cells 10 connected in series, and the output of the VCO cell 10 at last stage is fed back to an input terminal of the VCO cell 10 at first stage, as shown in FIG. 2.

In the circuit of FIG. 1, when the power supply voltage VDD is, for example, 1.5V, the current generator bias circuit 3 supplies bias so that the gate terminal of the PMOS transistor Q1 becomes about 0.5V.

The VCO cell 10 controls the oscillating frequency by controlling impedances of the variable impedance loads 1 and 2. The impedance values of the variable impedance loads 1 and 2 are controlled by a voltage of a CONT terminal. More specifically, when the voltage of the CONT terminal is high, the impedances of the variable impedance loads 1 and 2 go down and the oscillating frequency goes up. Conversely, when the voltage of the CONT terminal is low, impedances of the variable impedance loads 1 and 2 go up and the oscillating frequency goes down.

Figure 3:
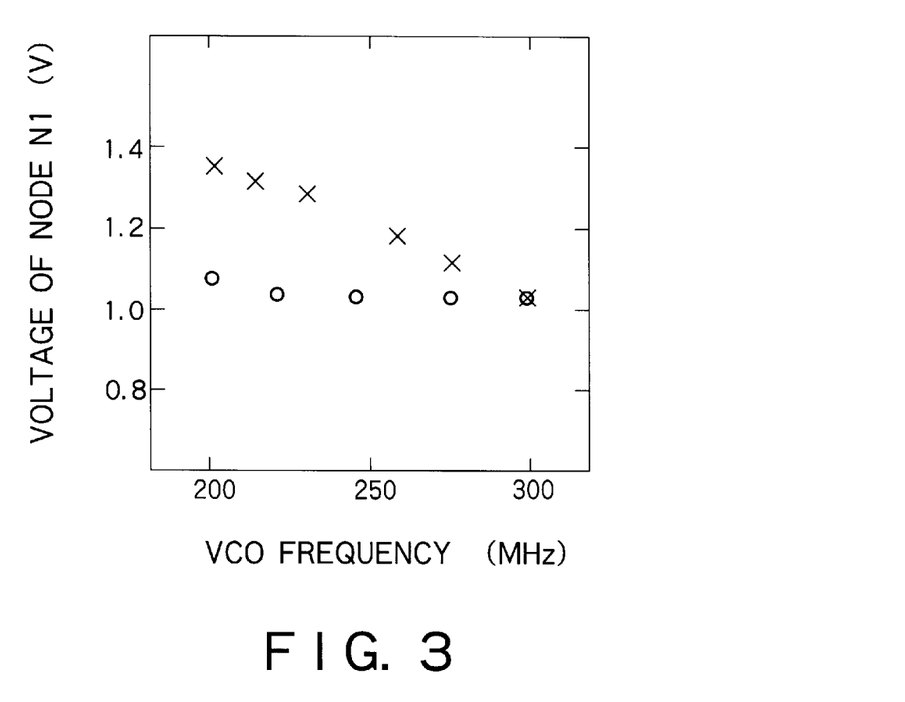
FIG. 3 is a diagram of plotting a relationship between the oscillating frequency of the VCO and the drain voltage of the PMOS transistor Q1 composing of the current generator.

FIG. 3 is a diagram of plotting a relationship between the oscillating frequency of the VCO and the drain voltage of the PMOS transistor Q1 composing of the current generator (the voltage of the node N1). The plots "X" of FIG. 3 denote voltage change of the node N1 in the circuit of FIG. 1. FIG. 3 shows a simulation result in the circuit using a CMOS technique of 0.35 $\mu$m.

As mentioned above, in case of lowering the oscillating frequency, the conventional VCO has performed control so that the impedances of the variable impedance loads 1 and 2 goes up. Because of this, as shown in FIG. 1, the lower the oscillating frequency is, the higher the voltage of the node N1 becomes. For example, when the oscillating frequency is 200 MHz, the node N1 reaches 1.35V.

In CMOS process of 0.35 $\mu$m, a threshold voltage of the PMOS transistor is 0.55V. Because of this, when the oscillating frequency of the VCO goes down, the PMOS transistor Q1 deviates a pentode region (saturation region) and operates at a triode region (non-saturation region). In the triode region, the drain current ID changes largely in accordance with change of the voltage between the drain and the source. Because of this, there is a problem that constant current performance of the PMOS transistor Q1 deteriorates in low frequency range.

In FIG. 3, the voltage level of the node N1 in case of operating at 300 MHz is set to about 1.0V. However, when the voltage of the node N1 is further lowered in order to avoid the triode operation of the PMOS transistor Q1, the output amplitude of the VCO becomes small, and a stable oscillation becomes difficult.

Figure 4:
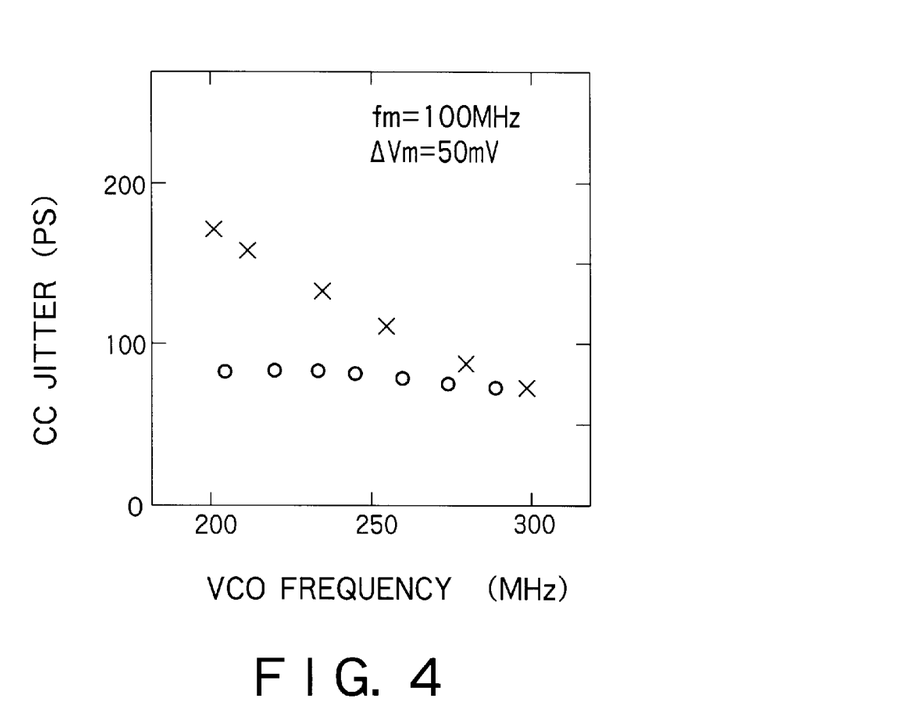
FIG. 4 is a diagram of plotting a relationship between the oscillating frequency of the VCO and a Cycle-to-Cycle jitter.
Figure 5:
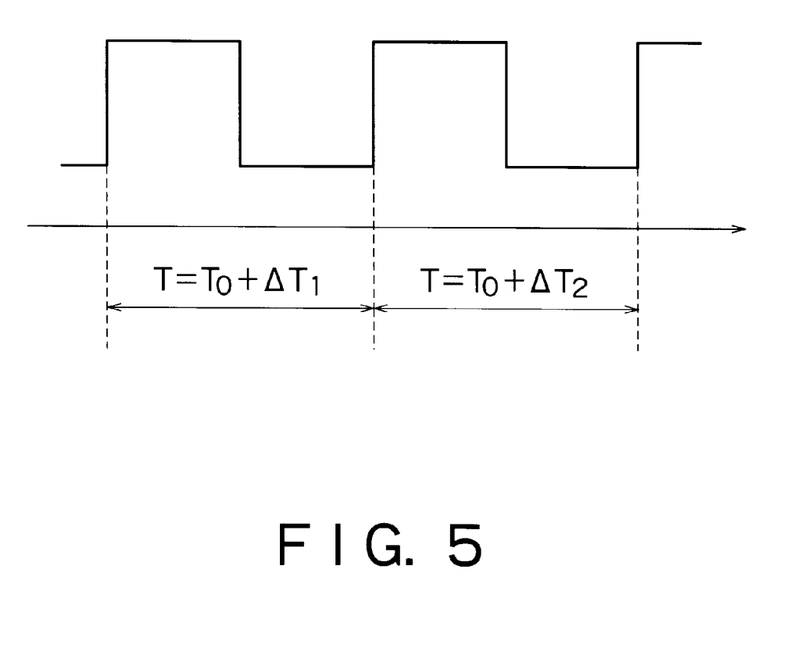
FIG. 5 is a diagram of explaining a CC jitter.

FIG. 4 is a diagram of plotting a relationship between the oscillating frequency of the VCO and a Cycle-to-Cycle jitter (hereinafter, called CC jitter). The plots "X" of FIG. 4 denote a frequency change of the CC jitter in the circuit of FIG. 1. Here, the CC jitter expresses fluctuation at each period of a difference $\Delta Tj$ between each period T of the oscillating signal and an average period T0 of the oscillating signal as shown in FIG. 5.

FIG. 4 is a diagram of showing the result of calculating a square root average of the CC jitter in case of forcibly adding a sign wave noise by a simulation. As shown in FIG. 4, the lower the oscillating frequency of the VCO is, the more the CC jitter increases.

SUMMARY OF THE INVENTION

An object of the present invention is to provide a semiconductor integrated circuit and a phase locked loop circuit capable of performing stable oscillating operation and generating an oscillating signal with little jitter.

In order to achieve the foregoing object, a semiconductor integrated circuit, comprising:

a first FET connected between a first voltage terminal and a first node;

a second FET connected between said first node and a first output terminal;

a third FET connected between said first node and a second output terminal;

a first variable impedance load connected between said first output terminal and a second voltage terminal;

a second variable impedance load connected between said second output terminal and said second voltage terminal;

a first bias circuit connected between said first node and said second voltage terminal, said first bias circuit setting said first node to substantially a constant voltage, regardless of impedance values of said first and second variable impedance loads; and a current generator bias circuit configured to supply a bias voltage to a gate terminal of said first FET, wherein a first input terminal is connected to a gate terminal of said second FET, and a second input terminal is connected to a gate terminal of said third FET.

According to the present invention, a first bias circuit is provided between a first node and a second voltage terminal in order to perform control so that the first node is set to substantially a constant voltage. Because of this, even if impedances of the first and second variable impedance loads change, it is possible to allow the first MOSFFET to constantly operate at the pentode region. Accordingly, when composing of the voltage control oscillator by using the semiconductor integrated circuit according to the present invention, it is possible to allow the oscillating operation to stabilize, thereby reducing a Cycle-to-Cycle jitter of the oscillating signal.

Furthermore, a semiconductor integrated circuit, comprising:

a VCO cell circuit including a first FET connected between a first voltage terminal and a first node, a second FET connected between said first node and a first output terminal, a third FET connected between said first node and a second output terminal, a first variable impedance load connected between said first output terminal and a second voltage terminal, a second variable impedance load connected between said second output terminal and said second voltage terminal, and a first bias circuit connected between said first node and said second voltage terminal, said first bias circuit setting said first node to substantially a constant voltage, regardless of impedance values of said first and second variable impedance loads;

a dummy cell circuit constituted in the same way as said VCO cell circuit; and a differential amplifier configured to control so that a voltage of a node corresponding to said first node in said dummy cell circuit coincides with a reference voltage, wherein said first bias circuit performs control so that said first node becomes substantially a constant voltage, regardless of impedance values of said first and second variable impedance loads.

Furthermore, a semiconductor integrated circuit, comprising:

a VCO cell circuit including a first FET connected between a first voltage terminal and a first node, a second FET connected between said first node and a first output terminal, a third FET connected between said first node and a second output terminal, a first variable impedance load connected between said first output terminal and a second voltage terminal, a second variable impedance load connected between said second output terminal and said second voltage terminal, and a first bias circuit connected between said first node and said second voltage terminal, said first bias circuit setting said first node to substantially a constant voltage, regardless of impedance values of said first and second variable impedance loads;

a dummy cell circuit including a fourth FET connected between said first voltage terminal and a second node, a fifth FET and a third variable impedance load connected in series between said second node and said second voltage terminal, a sixth FET and a fourth variable impedance load connected in series between said second node and said second voltage terminal, and a second bias circuit connected between said second node and said second voltage terminal;

a differential amplifier configured to control said first and second bias circuit so that said a voltage of said second node becomes equal to a prescribed reference voltage; and a current generator bias circuit configured to supply a bias voltage to gate terminals of said first and fourth FETs, wherein a gate terminal of said fifth FET is connected to said second node, and a gate terminal of said sixth FET is connected to said second voltage terminal.

DESCRIPTION OF THE PREFERRED EMBODIMENTS

Hereinafter, a semiconductor integrated circuit and a phase locked loop circuit according to the present invention will be more specifically explained with reference to drawings.

Figure 6:
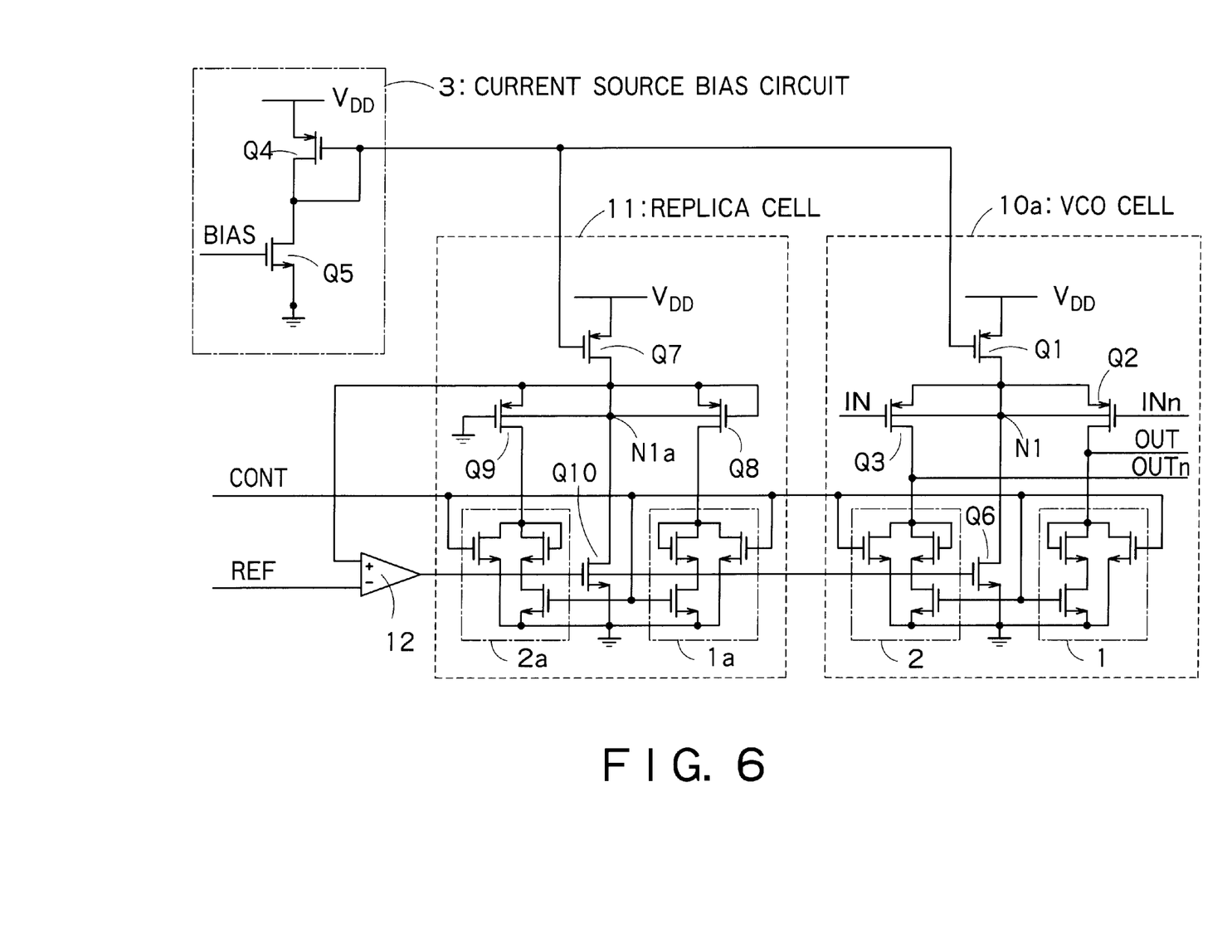
FIG. 6 is a circuit diagram of an embodiment of a semiconductor integrated circuit according to the present invention.

FIG. 6 is a circuit diagram of an embodiment of a semiconductor integrated circuit according to the present invention. A portion of the voltage control oscillator (VCO) is shown in FIG. 6. The VCO according to the present embodiment is provided with a VCO cell 10a, a replica cell (dummy cell circuit) 11 constituted in the same way as the VCO cell 10a, an operational amplifier (differential amplifier) 12, and a current generator bias circuit 3.

Figure 7:
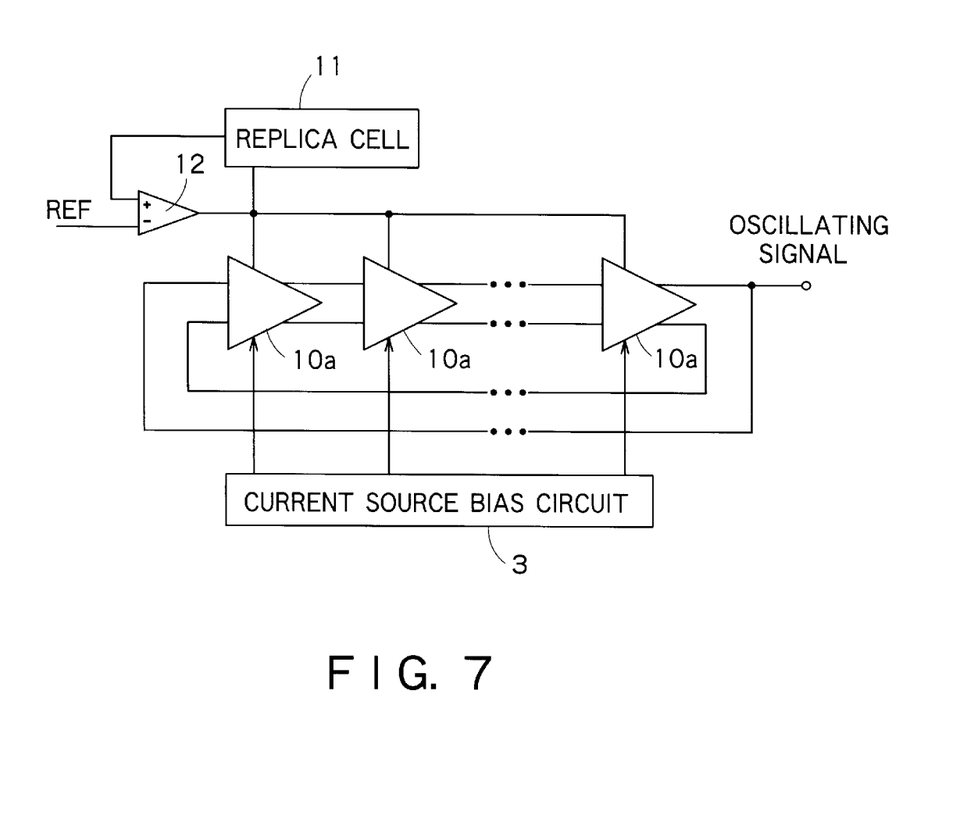
FIG. 7 is a block diagram showing a configuration of a VCO according to the present invention.

Although only one piece of the VCO cell 10a is shown in FIG. 6, a plurality of VCO cells 10a are practically connected in series, as shown in FIG. 7. Of a plurality of VCO cells connected in series, output terminals OUT and OUTn of the VCO cells 10a at last stage are connected to input terminals IN and INn of the VCO cell 10a at first stage. The current generator bias circuit 3 supplies a bias voltage to all of the VCO cell 10a.

In FIG. 6, the same reference numbers are attached to constituents common to those in the conventional VCO cell 10a. Hereinafter, point of difference will be mainly explained. The VCO cell 10a of FIG. 6 has a NMOS transistor (first bias circuit) Q6 connected between the node N1 and the ground terminal, different from the VCO cell circuit 10 of FIG. 1. The output terminal of the operational amplifier 12 is connected to the gate terminal of the NMOS transistor.

The replica cell 11 of FIG. 6 is basically constituted in the same way as the VCO cell 10a. The replica cell 11 has a PMOS transistor (fourth MOSFET) Q7 connected between the power supply VDD and the node N1a, a PMOS transistor (fifth MOSFET) Q8 and a variable impedance load (third variable impedance load) 1a, a PMOS transistor (sixth MOSFET) Q9 and a variable impedance element (fourth variable impedance load) 2a connected in series between the node N1a and the ground terminal, and an NMOS transistor (second bias circuit) Q10 connected between the node N1a and the ground terminal. Output terminal of the operational amplifier 12 is connected to a gate terminal of the NMOS transistor Q10.

The gate terminal of the PMOS transistor Q9 in the replica cell 11 is grounded, and the gate terminal of the PMOS transistor Q8 is connected to the node N1a.

The operational amplifier 12 of FIG. 6 outputs the voltage in accordance with voltage difference between the voltage of the node N1a in the replica cell 11 and the reference voltage REF. The reference voltage REF is generated by using a BGR circuit and so on.

The operational amplifier 12 controls the gate voltages of the NMOS transistor Q6 in the VCO cell 10a and the NMOS transistor Q10 in the replica cell 11 so that the voltage of the node N1a becomes equal to the reference voltage REF. By such a control, the voltages of the nodes N1 and N1a substantially become equal to the reference voltage REF.

That is, even if driving forces of the PMOS transistor and the NMOS transistor fluctuates during manufacturing of the circuit, the voltage of the node N1 is controlled so as to become equal to the reference voltage.

Furthermore, in the conventional configuration shown in FIG. 1, when the oscillating frequency of the VCO goes down, there is a problem that due to the influence that the variable impedance loads 1 and 2 become large, the voltage of the node N1 goes up and the PMOS transistor Q1 operates at triode region. However, according to the present embodiment, even if the oscillating frequency of the VCO goes down and the variable impedance loads 1 and 2 become large, the NMOS transistor Q6 is controlled to be a low impedance by the operational amplifier 12, thereby restraining the voltage-up of the node N1.

Because of this, according to the present embodiment, regardless of the oscillating frequency of the node N1, it is possible to control the voltage of the node N1 substantially at a constant value, and to allow the PMOS transistor to always operate at pentode region, thereby stabilizing the oscillating operation.

The plots "○" of FIG. 3 show a relationship between the oscillating frequency of the VCO and the voltage of the node N1 according to the present embodiment. As obvious from FIG. 3, according to the present embodiment, even if the oscillating frequency of the VCO changes, the voltage of the node N1 changes little.

On the other hand, the plots "○" of FIG. 4 show a relationship between the oscillating frequency of the VCO and the CC jitter according to the present embodiment. As obvious from FIG. 4, according to the present embodiment, the CC jitter is substantially constant regardless of the oscillating frequency of the VCO, and even if the oscillating frequency of the VCO goes down, the CC jitter never increase.

Thus, according to the present embodiment, the NMOS transistor Q6 is connected between the drain terminal (node N1) of the PMOS transistor Q1 in the VCO cell 10a and the ground terminal, there is provided with the replica cell 11 constituted in the same way as the VCO cell 10a, and the operational amplifier 12 performs control so that the voltage of the node N1a in the replica cell 11 and the voltage of the node N1 in the VCO cell 10a become equal to the reference voltage REF. Therefore, even if the oscillating frequency changes, the voltage of the node N1 becomes substantially constant. Because of this, the PMOS transistor Q1 always operates at pentode region, thereby stabilizing the oscillating operation. Furthermore, according to the present embodiment, the CC jitter at low frequency side can be reduced more efficiently than that of the conventional circuit.

Figure 8:
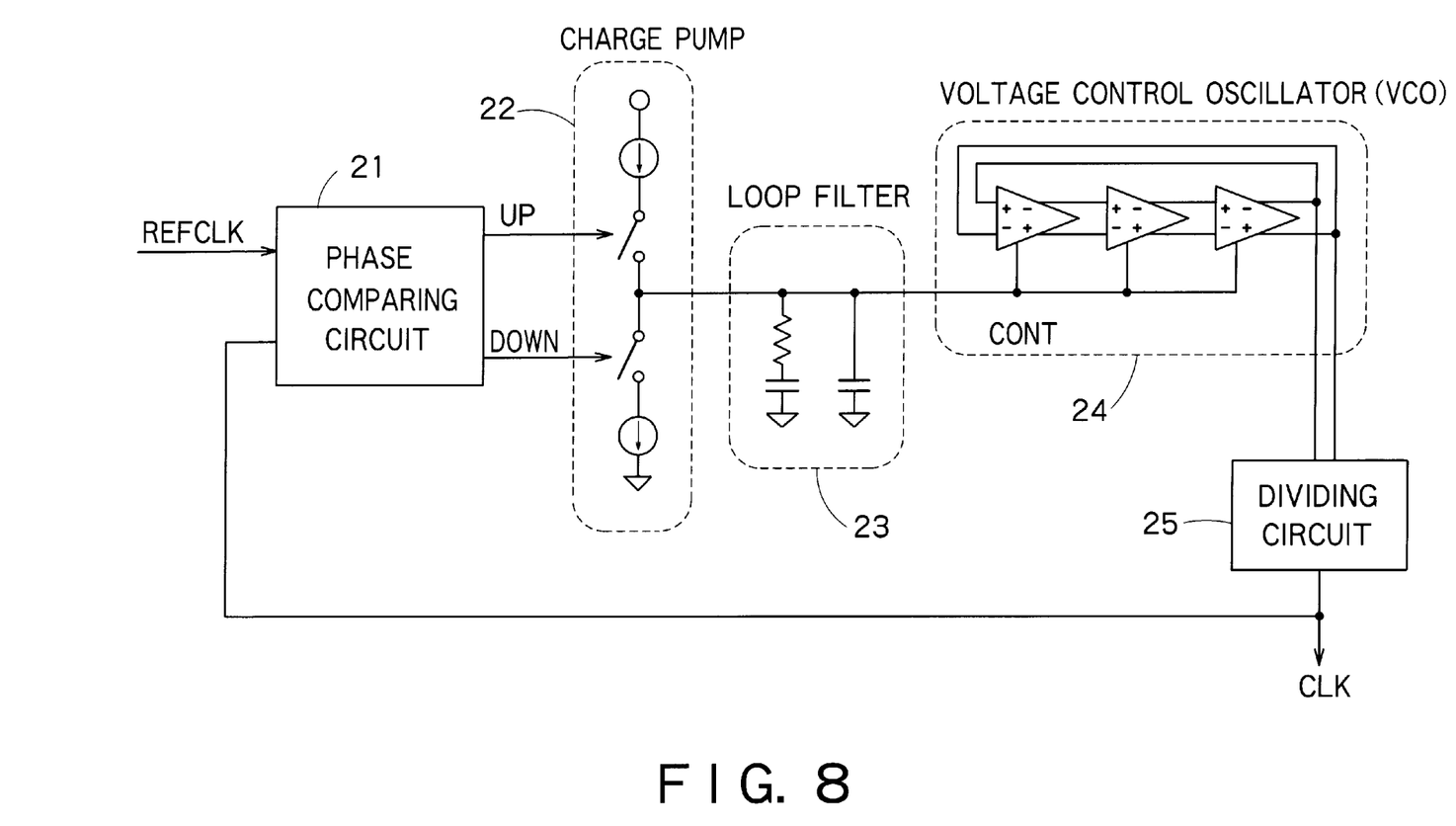
FIG. 8 is a block diagram showing schematic configuration of a PLL circuit.

The VCO according to the present embodiment can use in the PLL (Phase Locked Loop) circuit. FIG. 8 is a block diagram of showing schematic configuration of the PLL circuit. The PLL circuit of FIG. 8 has a phase comparing circuit 21 for detecting phase difference between the reference clock REFCLK and the feedback signal CLK to output an UP signal and a down signal, a charge pump 22 for outputting the voltage signal in accordance with the UP signal and the DOWN signal, a loop filter 23 for removing unnecessary high frequency component included in a voltage signal outputted from the charge pump 22, a VCO 24 constituted in the same way as those of FIG. 6 and FIG. 7 which controls the oscillating frequency of the oscillating signal based on the voltage signal passing through the loop filter 23, and a dividing circuit 25 for generating the feedback signal CLK by dividing the oscillating signal outputted from the VCO 24.

In FIG. 8, the charge pump 22 and the loop filter 23 correspond to a control signal output circuit, and the dividing circuit 25 to a feedback circuit, respectively.

Figure 9A:
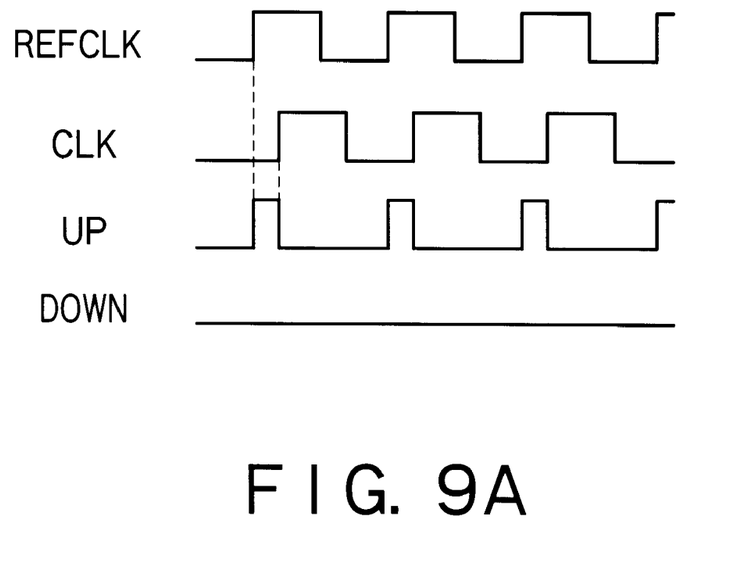
FIGS. 9A–9B are timing diagrams of an input/output signals of a phase comparing circuit.
Figure 9B:
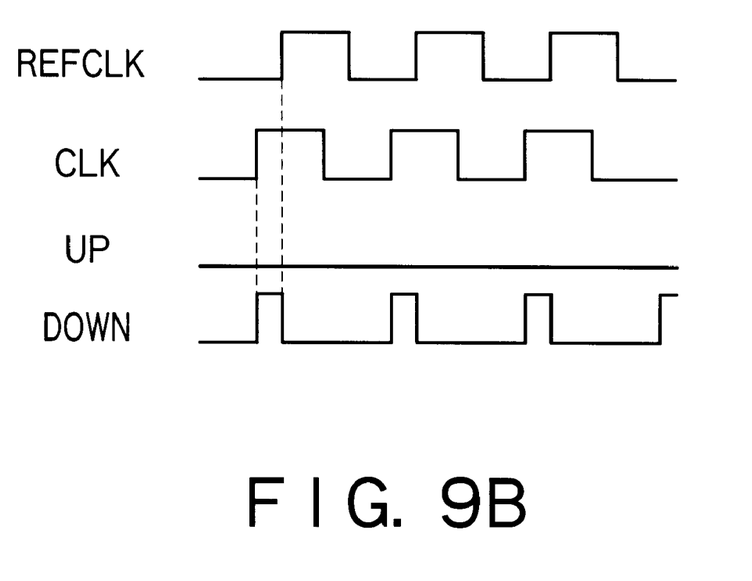

FIG. 9 is a timing chart of input-output signals of the phase comparing circuit 21. When the phase of th ereference clock REFCLK goes on earlier than the feedback signal CLK, as shown in FIG. 9A, from when the reference clock REFCLK rises until when the feedback signal falls, the UP signal is outputted. On the other hand, when the phase of the reference clock REFCLK goes on later than the feedback signal CLK, as shown in FIG. 9B, from when the feedback signal CLK rises until when the reference clock REFCLK rises, the DOWN signal is outputted.

Because the oscillating signal generated by the VCO 24 has little CC jitter, it is possible to stabilize the oscillating operation in the PLL circuit, thereby generating the oscillating signal of which the frequency accuracy is high.

Conductive types of each transistor shown in FIG. 6 may be reverse. In this case, connection between the power supply terminal and the ground terminal also has to be reverse.

What is claimed is:

1. A semiconductor integrated circuit, comprising:
   a first FET connected between a first voltage terminal and a first node;
   a second FET connected between said first node and a first output terminal;
   a third FET connected between said first node and a second output terminal;
   a first variable impedance load connected between said first output terminal and a second voltage terminal;
   a second variable impedance load connected between said second output terminal and said second voltage terminal;
   a first bias circuit connected between said first node and said second voltage terminal, said first bias circuit setting said first node to substantially a constant voltage, regardless of impedance values of said first and second variable impedance loads; and a current generator bias circuit configured to supply a bias voltage to a gate terminal of said first FET, wherein a first input terminal is connected to a gate terminal of said second FET, and a second input terminal is connected to a gate terminal of said third FET.

2. A semiconductor integrated circuit, comprising:

a VCO cell circuit including a first FET connected between a first voltage terminal and a first node, a second FET connected between said first node and a first output terminal, a third FET connected between said first node and a second output terminal, a first variable impedance load connected between said first output terminal and a second voltage terminal, a second variable impedance load connected between said second output terminal and said second voltage terminal, and a first bias circuit connected between said first node and said second voltage terminal, said first bias circuit setting said first node to substantially a constant voltage, regardless of impedance values of said first and second variable impedance loads;

a dummy cell circuit constituted in the same way as said VCO cell circuit; and a differential amplifier configured to control so that a voltage of a node corresponding to said first node in said dummy cell circuit coincides with a reference voltage, wherein said first bias circuit performs control so that said first node becomes substantially a constant voltage, regardless of impedance values of said first and second variable impedance loads.

3. The semiconductor integrated circuit according to claim 2, wherein a plurality of said VCO cell circuits are connected in series;

said first output terminal of said VCO cell circuit at preceding stage is connected to said first or second input terminal of said VCO cell circuit at subsequent stage;

said second output terminal of said VCO cell circuit at preceding stage is connected to said second or first output terminal of said VCO cell circuit at subsequent stage;

said first output terminal of said VCO cell circuit at last stage is connected to said first or second input terminal of said VCO cell circuit at first stage; and said second output terminal of said VCO cell circuit at last stage is connected to said first or second input terminal of said VCO cell circuit at first stage.

4. The semiconductor integrated circuit according to claim 3, wherein said current generator bias circuit supplies the bias voltage to gate terminals of said first FETs in all of said VCO cell circuits connected in series and all of the corresponding gate terminals in said dummy cell circuit.

5. The semiconductor integrated circuit according to claim 3, wherein said dummy cell circuit is connected to each of a plurality of said VCO cell circuits connected in series.

6. The semiconductor integrated circuit according to claim 3, wherein an output of said differential amplifier is supplied to said first bias circuits of all of said VCO cell circuits connected in series.

7. The semiconductor integrated circuit according to claim 2, wherein each of said first and second bias circuits is constituted of FETS having a conductive type different from said second FET, said third FET, and the corresponding FET in said dummy cell circuit; and an output terminal of said differential amplifier is connected to gate terminals of the FETs having said reverse conductive type.

8. A phase locked loop circuit, comprising:

a phase comparing circuit configured to detect a phase difference between a reference signal and a feedback signal;

a control signal output circuit configured to output a control voltage signal in accordance with the detected phase difference;

a semiconductor integrated circuit according to claim 2 configured to control a frequency of an oscillating signal based on said control voltage signal; and a feedback circuit configured to generate said feedback signal based on said oscillating signal.

9. A semiconductor integrated circuit, comprising:

a VCO cell circuit including a first FET connected between a first voltage terminal and a first node, a second FET connected between said first node and a first output terminal, a third FET connected between said first node and a second output terminal, a first variable impedance load connected between said first output terminal and a second voltage terminal, a second variable impedance load connected between said second output terminal and said second voltage terminal, and a first bias circuit connected between said first node and said second voltage terminal, said first bias circuit setting said first node to substantially a constant voltage, regardless of impedance values of said first and second variable impedance loads;

a dummy cell circuit including a fourth FET connected between said first voltage terminal and a second node, a fifth FET and a third variable impedance load connected in series between said second node and said second voltage terminal, a sixth FET and a fourth variable impedance load connected in series between said second node and said second voltage terminal, and a second bias circuit connected between said second node and said second voltage terminal;

a differential amplifier configured to control said first and second bias circuit so that said a voltage of said second node becomes equal to a prescribed reference voltage; and a current generator bias circuit configured to supply a bias voltage to gate terminals of said first and fourth FETS, wherein a gate terminal of said fifth FET is connected to said second node, and a gate terminal of said sixth FET is connected to said second voltage terminal.

10. The semiconductor integrated circuit according to claim 9, wherein a plurality of said VCO cell circuits are connected in series;

said first output terminal of said VCO cell circuit at preceding stage is connected to said first or second input terminal of said VCO cell circuit at subsequent stage;

said second output terminal of said VCO cell circuit at preceding stage is connected to said second or first output terminal of said VCO cell circuit at subsequent stage;

said first output terminal of said VCO cell circuit at last stage is connected to said first or second input terminal of said VCO cell circuit at first stage; and said second output terminal of said VCO cell circuit at last stage is connected to said first or second input terminal of said VCO cell circuit at first stage.

11. The semiconductor integrated circuit according to claim 10, wherein said current generator bias circuit supplies the bias voltage to gate terminals of said first FETs in all of said VCO cell circuits connected in series and the gate terminal of said fourth FET in said dummy cell circuit.

12. The semiconductor integrated circuit according to claim 10, wherein said dummy cell circuit is connected to each of a plurality of said VCO cell circuits connected in series.

13. The semiconductor integrated circuit according to claim 10, wherein an output of said differential amplifier is supplied to said first bias circuits of all of said VCO cell circuits connected in series.

14. The semiconductor integrated circuit according to claim 9, wherein each of said first and second bias circuits is constituted of FETs having a conductive type different from said second FET, said third FET, said fifth FET, and said sixth FET; and an output terminal of said differential amplifier is connected to gate terminals of the FETs having said reverse conductive type.

15. A phase locked loop circuit, comprising:

a phase comparing circuit configured to detect a phase difference between a reference signal and a feedback signal;

a control signal output circuit configured to output a control voltage signal in accordance with the detected phase difference;

a semiconductor integrated circuit according to claim 9 configured to control a frequency of an oscillating signal based on said control voltage signal; and a feedback circuit configured to generate said feedback signal based on said oscillating signal.

* * * * *